(12) United States Patent
Warren et al.

(10) Patent No.: US 9,048,097 B2
(45) Date of Patent: Jun. 2, 2015

(54) SEMICONDUCTIVE MICRO- AND NANO-WIRE ARRAY MANUFACTURING

(71) Applicant: California Institute of Technology, Pasadena, CA (US)

(72) Inventors: Emily L. Warren, Pasadena, CA (US); Heather A. Audesirk, Los Angeles, CA (US); Nathan S. Lewis, La Canada Flintridge, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/972,809

(22) Filed: Aug. 21, 2013

(65) Prior Publication Data
US 2014/0057416 A1 Feb. 27, 2014

Related U.S. Application Data

(60) Provisional application No. 61/692,176, filed on Aug. 22, 2012.

(51) Int. Cl.
*H01L 21/02* (2006.01)

(52) U.S. Cl.
CPC ...... *H01L 21/0259* (2013.01); *H01L 21/02656* (2013.01); *H01L 21/0237* (2013.01); *H01L 21/02381* (2013.01); *H01L 21/02532* (2013.01); *H01L 21/02639* (2013.01); *H01L 21/02642* (2013.01); *H01L 21/02645* (2013.01); *H01L 21/02653* (2013.01)

(58) Field of Classification Search
CPC .................. H01L 21/0259; H01L 21/02656; H01L 21/0262
USPC ................. 257/5, E29.07; 438/213, 256, 478
See application file for complete search history.

(56) References Cited

U.S. PATENT DOCUMENTS 6,831,017 B1 * 12/2004 Li et al. .......................... 438/694

OTHER PUBLICATIONS

Pierret, Aurelie, et al., "Generic nano-imprint process for fabrication of nanowire arrays", 2010, Nanotechnology, 21, p. 2.*
Liu, Ying, et al., "Nanostructure formation via print diffusion etching through block copolymer templates", 2010, Nanoscale, 2, pp. 587-593.*
Ting, Yung-Chiang, et al., "Fabrication nano-pillars pattern on PDMS using anodic aluminum oxide film as template", 2012, International Society for Optics and Photonics, pp. 1-6.*
Li, Zhiwei, et al., "Hybrid nano imprint soft lithography with sub 15 nm resolution", 2009, Nano letters, 9, pp. 2306-2310.*

* cited by examiner

*Primary Examiner* — Fernando L Toledo
*Assistant Examiner* — Adam S Bowen
(74) *Attorney, Agent, or Firm* — Joseph R. Baker, Jr.; Gavrilovich, Dodd & Lindsey LLP

(57) ABSTRACT

The disclosure provides methods of manufacturing semiconductive structures using stamping and VLS techniques.

7 Claims, 5 Drawing Sheets

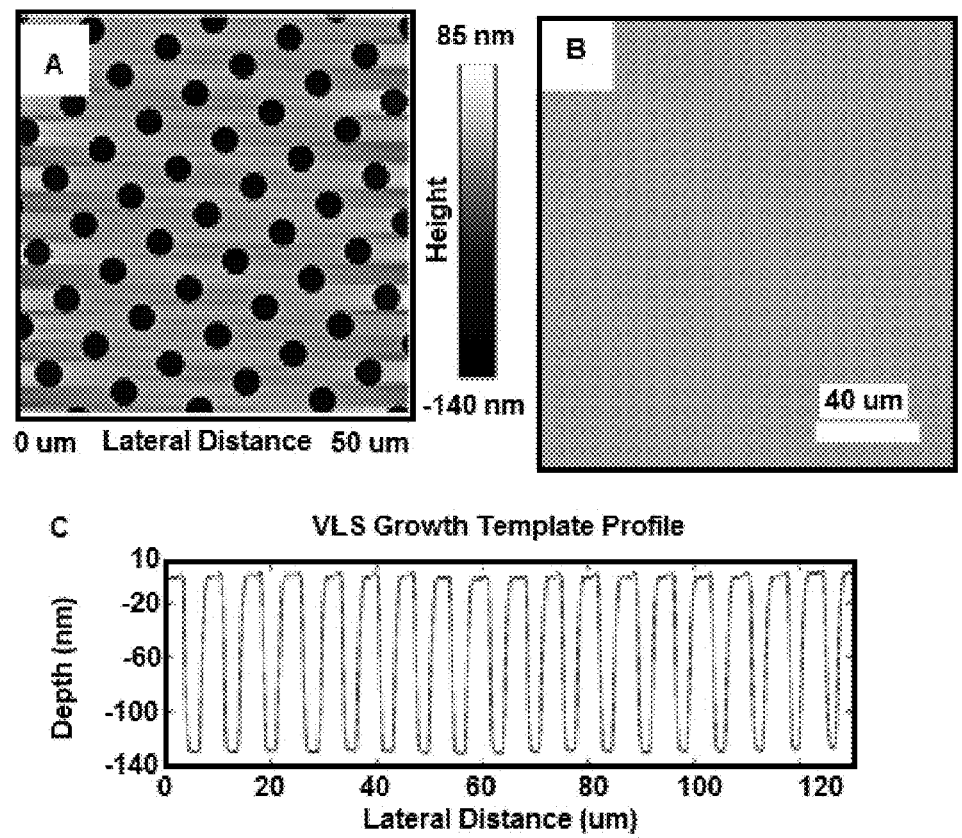
FIGURE 5A-C
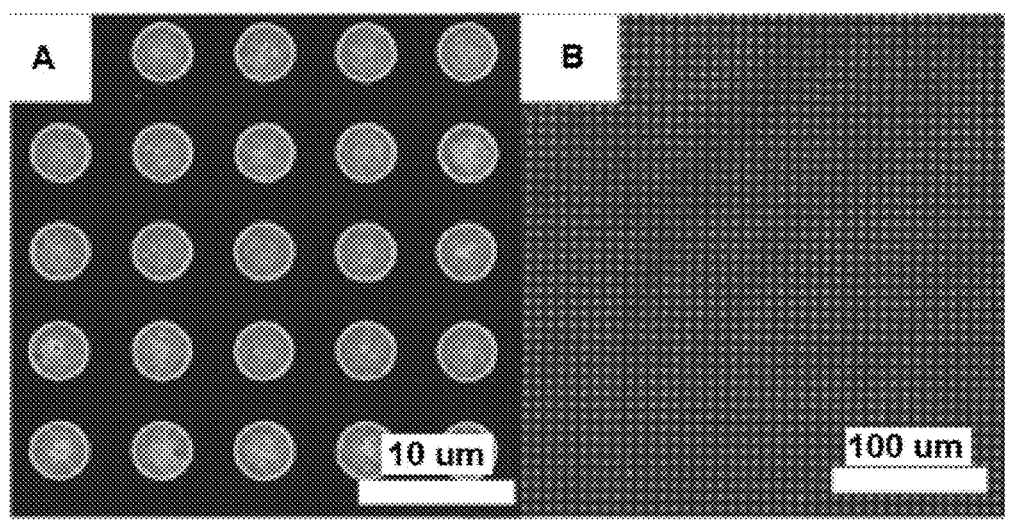
FIGURE 6A-B

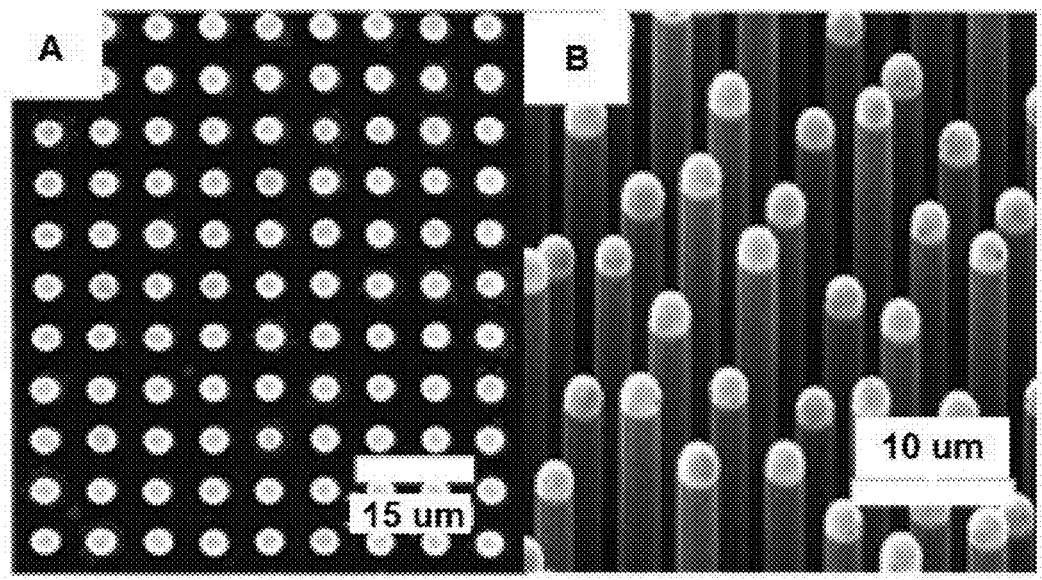
FIGURE 7A-B
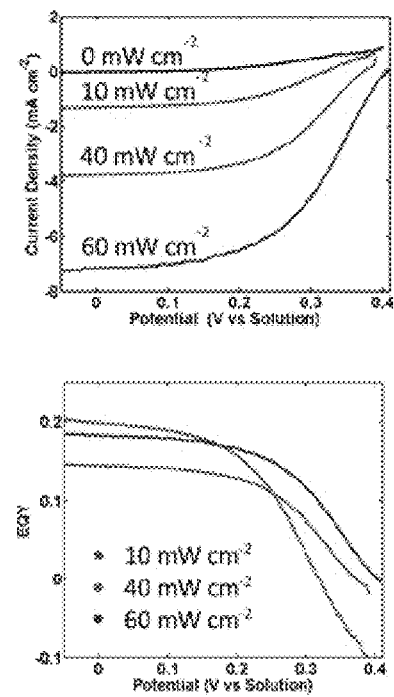
FIGURE 8

SEMICONDUCTIVE MICRO- AND NANO-WIRE ARRAY MANUFACTURING

CROSS REFERENCE TO RELATED APPLICATIONS

This application claims priority to U.S. Provisional Application Ser. No. 61/692,176, filed Aug. 22, 2012, the disclosure of which is incorporated herein by reference.

STATEMENT REGARDING FEDERALLY SPONSORED RESEARCH

This invention was made with government support under grant numbers DE-FG02-05ER15754 awarded by the U.S. Department of Energy. The government has certain rights in the invention.

TECHNICAL FIELD

This invention relates to photovoltaic cells, devices, methods of making and uses thereof.

BACKGROUND

Ordered arrays of crystalline-Si (c-Si) microwires, fabricated by the chemical-vapor-deposition, vapor-liquid-solid (CVD-VLS) growth mechanism, were pioneered nearly five years ago for sunlight-to-electrical power conversion. The VLS method is a robust and scalable approach for growth of crystalline materials from gaseous precursors. Specifically, the ability to directly produce high-quality, single-crystalline semiconducting material, without the need for further purification or wafering, makes $SiCl_4$ VLS growth an interesting approach for production of Si for energy-conversion applications.

The lab-scale processes developed to date to prepare the Si substrates required for the VLS growth of highly-ordered silicon microwire arrays rely on expensive, high-temperature and high-vacuum techniques. In previous work, an oxide-coated (111)-oriented Si growth wafer was photolithographically patterned to introduce a confining layer that prevents the catalyst droplets from aggregating during VLS growth, and controls the spacing and diameter of the resulting Si microwires. The VLS catalyst material (Cu, 99.999%) was then deposited across the entire wafer via thermal evaporation under high vacuum, and the excess metal was removed by lift-off in acetone. Demonstrating a more energy and cost efficient patterning technique would allow these microwire arrays to be manufactured in a high throughput manner and would be more broadly applicable to microstructured device manufacturing. Progress on this front has included demonstrating that the Si(111) substrate can be reused a limited number of times if the wires are peeled off in a flexible polymer film and catalyst metal is electrodeposited into the remaining oxide pattern.

SUMMARY

The disclosure provides a fabrication technique, using nano- or micro-imprint lithography and electrodeposition of a metal catalyst, that reduce the energy requirements and improve the scalability of patterning the VLS catalyst onto the Si(111) growth substrate.

The disclosure provides a method for fabricating semiconductor structures comprising the steps of (a) contacting a semiconductive substrate having a sol-gel layer with a stamp comprising agarose or PDMS and wherein the agarose or PDMS stamp has a pattern of structures extending from the planar surface of the agarose or PDMS approximately equal to the depth of the sol-gel layer on the semiconductive substrate, wherein the stamp imprints the negative of the pattern into the sol-gel layer; (b) removing the stamp from the semiconductive substrate; (c) electrodepositing a catalyst into patterned openings in the sol-gel layer on the semiconductive substrate; and (d) growing a set of semiconductor structures on the substrate, wherein the semiconductor structure growth is supported by a catalyst deposited in the openings. In one embodiment, the stamp comprises a PDMS bilayer. In another embodiment, the stamp comprises an agarose gel. In yet another embodiment, the semiconductive substrate comprises silicon. In another embodiment, the stamp is made by forming a templated oxide layer on a substrate, wherein the template for the templated oxide layer comprises openings in the oxide layer; and contacting the template oxide layer with PDMS to obtain a patterned PDMS stamp. In one embodiment, the catalyst comprises gold, copper, nickel or some combination thereof. In another embodiment, the agarose comprises hydrofluoric acid. In yet another embodiment, the method further comprises etching the sol-gel layer in hydrofluoric acid after step (b). In yet a further embodiment, the method further comprises reusing the substrate for fabricating additional semiconductor structures by etching and cleaning the Si substrate and repeating steps (a) through (d). In another embodiment, the method further comprises embedding or partially embedding the fabricated semiconductor structures in a binder material matrix wherein the conformably fills gaps between grown semiconductor structures. In one embodiment, the semiconductor structures comprise vertically aligned wire arrays.

The disclosure also provides a bilayer PDMS stamp comprising a plurality of raised protrusions.

The disclosure also provides a planar agrose stamp comprising plurality of raised protrusions and comprising absorbed hydrofluoric acid.

BRIEF DESCRIPTION OF THE DRAWINGS

FIG. 5A-C shows an array of wires. (A) Shows an AFM image of square packed 3×7 μm patterned silica sol-gel; (B) shows and optical microscope image of square packed 3×7 μm patterned silica sol-gel; and (C) shows profilometer data of square packed 3×7 μm patterned silica sol-gel.

FIG. 6A-B shows SEM images of eletrodeposited copper (A) 10 μm and (B) 100 μm. Diameters of Cu circles are about 3.5 μm, pitch is about 7 μm.

FIG. 7A-B shows SEM images of wire arrays grown from electro-deposited Cu and silica sol-gel patterned wafers. (A) Top-down view of as-grown array. (B) 45° view of as-grown array.

FIG. 8 shows J-V data (top) and quantum yield data (bottom) for SiMW arrays grown from a template created via a method of the disclosure.

DETAILED DESCRIPTION

Figure 1:
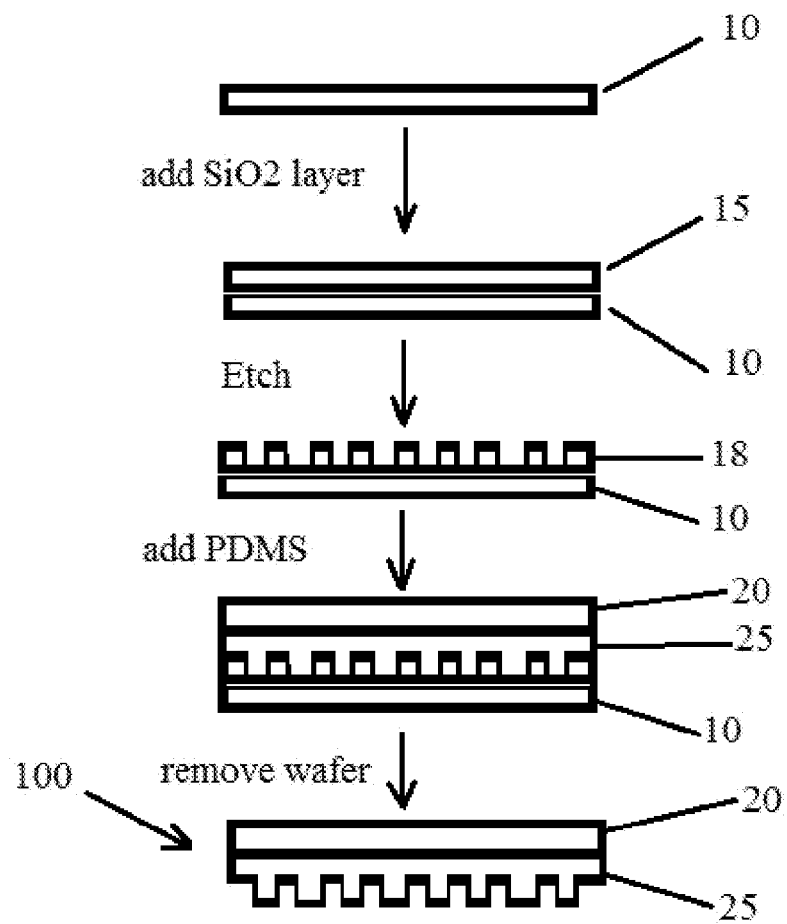
FIG. 1 shows a process of the disclosure for preparing a template stamp.

As used herein and in the appended claims, the singular forms "a," "and," and "the" include plural referents unless the context clearly dictates otherwise. Thus, for example, reference to "a pillar" includes a plurality of such pillars and reference to "the catalyst" includes reference to one or more catalysts known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

By "about" is meant a quantity, level, value, number, frequency, percentage, dimension, size, amount, weight or length that varies by as much as 30, 25, 20, 25, 10, 9, 8, 7, 6, 5, 4, 3, 2 or 1% to a reference quantity, level, value, number, frequency, percentage, dimension, size, amount, weight or length. With respect to ranges of values, the invention encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

The term "array" generally refers to multiple numbers of structures distributed within an area and spaced apart, unless otherwise indicated. Structures within an array all do not have to have the same orientation and the structures need not be evenly distributed, although in some instances an evenly spaced ordered array would be desirable.

The term "aspect ratio" refers to the ratio of a structure's length to its width. Hence, the aspect ratios of the elongate structures will be greater than one. In various embodiments, the diameter of, for example, a "rod" or "wire" is about 10 nm-50 nm, about 50 nm-100 nm, about 100 nm-500 nm, about 500 nm-1 µm, about 1 µm-10 µm or about 10 µm-100 µm. Typically the diameter will be about 1 µm-10 µm. The length of the "rod" or "wire" is about 1 µm-10 µm, about 10 µm-100 µm, or about 100 µm-several millimeters.

The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity.

The terms "ordered" or "well-defined" generally refer to the placement of elements in a specified or predetermined pattern where the elements have distinct spatial relationships to one another. Hence, the terms "ordered array" or "well-defined" generally refer to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings. The structures within "ordered" or "well-defined" arrays may also have similar orientations with respect to each other.

"Polymer" refers to a molecule comprising a plurality of repeating chemical groups, typically referred to as monomers. Polymers are often characterized by high molecular masses. Polymers useable in the disclosure may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the disclosure. Polymers useable in the methods, devices and device components of the disclosure include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these. "Prepolymer" refers to a material that is capable of undergoing polymerization but that is in its unpolymerized liquid or gel state. "Elastomer" refers to a polymeric material which can be stretched or deformed and return to its original shape without substantial permanent deformation. Elastomers commonly undergo substantially elastic deformations. Exemplary elastomers useful in the disclosure may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the disclosure may include, but are not limited to, silicon containing polymers such as polysiloxanes including poly(dimethyl siloxane) (i.e PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones.

A "photovoltaic cell" is an electrical device comprising a semiconductor that converts light or other radiant energy, in the range from ultraviolet to infrared radiation, incident on its surface into electrical energy in the form of power/voltage/current and which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light, including solar radiation, incident on its surface into electrical energy. Electromagnetic Radiation to Electric Energy Conversion Device (EREECD) is a device that reacts with electromagnetic (optical) radiation to produce electrical energy. Optoelectronic Energy Device (OED) refers to a device that reacts with optical radiation to produce electrical energy with an electronic device.

A photovoltaic ("PV") cell may be connected in parallel, in series, or a combination thereof with other such cells. A common PV cell is a p-n junction device based on crystalline silicon. In various embodiments of the disclosure a PV cell comprises p-n junction devices of silicon microwires. Other types of PV cells can be based on a p-n junction cell of silicon and other semiconductive materials, such as, but not limited to, amorphous silicon, polycrystalline silicon, germanium, organic materials, and Group III-V semiconductor materials, such as gallium arsenide (GaAs). In some embodiments an Si based material may be further coated with a second semiconductive material having a different bandgap than the Si, typically a wider bandgap.

During operation of a photovoltaic cell, incident solar or light radiation penetrates below a surface of the PV cell and is absorbed. The depth at which the solar radiation penetrates depends upon an absorption coefficient of the cell. In the case of a PV cell based on silicon, an absorption coefficient of silicon varies with wavelength of solar radiation. At a particular depth within the PV cell, absorption of solar radiation produces charge carriers in the form of electron-hole pairs. Electrons flow through one electrode connected to the cell, while holes exit through another electrode connected to the cell. The effect is a flow of an electric current through the cell driven by incident solar radiation. Inefficiencies exist in current solar cells due to the inability to collect/use and convert the entire incident light.

As used herein, the term "n-type" refers to a semiconductor that is doped to possess an excess of negative charge carriers, i.e. electrons. For example, when a pentavalent dopant atom, e.g. phosphorus, arsenic, or antimony, substitutes for a tetravalent atom in a semiconductor, e.g. silicon, the dopant introduce an additional negative charge into the semiconductor as a consequence of the dopant atom's greater valency.

As used herein, the term "p-type" refers to a semiconductor that is doped so that there is an excess of positive charge carriers, i.e. holes. For example, when a trivalent dopant atom, e.g. aluminum or boron, is substituted for a tetravalent atom in a semiconductor, e.g. silicon, the dopant atom introduces an additional positive charge into the semiconductor as a consequence of the dopant atom's smaller valency.

Also, in accordance with a typical pn junction cell design of a PV cell, charge separation of electron-hole pairs is typically confined to a depletion region, which can be limited to a thickness of about 1 µm or less. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current. Multi-junction solar cells or tandem cells are solar cells containing several p-n junctions. Each junction can be tuned to a different wavelength of light, reducing one of the largest inherent sources of losses, and thereby increasing efficiency. Traditional single-junction cells have a maximum theoretical efficiency of 34%, a theoretical "infinite-junction" cell would improve this to 87% under highly concentrated sunlight.

"N-P junction" refers to a connection between a p-type semiconductor and an n-type semiconductor which produces a diode. Depletion region refers to the transition region between an n-type region and a p-type region of an N/P junction where a high electric field exists.

As used herein, the terms "lightly-doped" or "minimally doped" refer to a semiconductor that is only minimally doped so that the electronic structure is more similar to an insulator than it is to a conductor. A doping of less than $10^{16}$ cm$^{-3}$ (e.g., less than $10^{15}$ cm$^{-3}$, $10^{14}$ cm$^{-3}$, $10^{13}$ cm$^{-3}$) can be considered lightly doped or minimally doped material. In a specific embodiment, the doping is less than $10^{14}$ cm$^{-3}$.

As used herein, the terms "heavily-doped" refer to a semiconductor that is doped to such an extent that the electronic structure is more similar to a conductor than to an insulator. For example, the doping values of $2.5 \times 10^{19}$ and $6.6 \times 10^{19}$ cm$^{-3}$ are associated with heavily doped materials.

As used herein, the term "ultraviolet range" refers to a range of wavelengths from about 5 nm to about 400 nm. As used herein, the term "visible range" refers to a range of wavelengths from about 400 nm to about 700 nm. As used herein, the term "infrared range" refers to a range of wavelengths from about 700 nm to about 2 mm. The infrared range includes the "near infrared range," which refers to a range of wavelengths from about 700 nm to about 5 µm, the "middle infrared range," which refers to a range of wavelengths from about 5 µm to about 30 µm, and the "far infrared range," which refers to a range of wavelengths from about 30 µm to about 2 mm.

Within this description, the term "semiconductive material", "semiconductor" or "semiconducting substrate" and the like is generally used to refer to elements, structures, or devices, etc. comprising materials that have semiconductive properties, unless otherwise indicated. Such materials include, but are not limited to: materials including elements from Group IV of the periodic table; materials including elements from Group III and Group V of the periodic table, such as, for example, GaAs, GaP, GaAs$_x$P$_{1-x}$, Al$_x$Ga$_{1-x}$, Al$_x$Ga$_{1-x}$As$_y$P$_{1-y}$, In$_x$Ga$_{1-x}$As, In$_x$Ga$_{1-x}$P, In$_x$Ga$_{1-x}$As$_y$P$_{1-y}$, Al$_x$In$_{1-x}$As$_y$P$_{1-y}$, Al$_x$Ga$_{1-x}$As$_y$N$_z$P$_{1-y-z}$, InGa$_{1-x}$As$_y$N$_z$P$_{1-y-z}$, Zn$_3$P$_2$, Zn$_3$S$_2$, and ZnP$_x$S$_{1-x}$ ($0 \leq x \leq 1$, $0 \leq y \leq 1$, $0 \leq z \leq 1$, $0 \leq y+z \leq 1$); materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconducting structure" refers to a structure consisting of, at least in part, a semiconducting material. A semiconducting structure may comprise either doped or undoped material. In some embodiments, the material is minimally doped. As used herein and throughout the disclosure a semiconductive material (sometimes referred to as photoactive material) can be selected from the group consisting of Si, TiO$_2$, CaTiO$_3$, SrTiO$_3$, Sr$_3$Ti$_2$O$_7$, Sr$_4$Ti$_3$O$_{10}$, Rb$_2$La$_2$Ti$_3$O$_{10}$, $CS_2La_2Ti_3O_{10}$, $CsLa_2Ti_2NbO_{10}$, $La_2TiO_5$, $La_2Ti_3O_9$, $La_2Ti_2O_7$, $La_2Ti_2O_7$:Ba, $KaLaZr_{0.3}Ti_{0.7}O_4$, $La_4CaTi_5O_{17}$, $KTiNbO_5$, $Na_2Ti_6O_{13}$, $BaTi_4O_9$, $Gd_2Ti_2O_7$, $Y_2Ti_2O_7$, $ZrO_2$, $K_4Nb_6O_{17}$, $Rb_4Nb_6O_{17}$, $Ca_2Nb_2O_7$, $Sr_2Nb_2O_7$, $Ba_5Nb_4O_{15}$, $NaCa_2Nb_3O_{10}$, $ZnNb_2O_6$, $Cs_2Nb_4O_{11}$, $La_3NbO_7$, $Ta_2O_5$, $KsPrTa_5O_{15}$, $K_3Ta_3Si_2O_{13}$, $K_3Ta_3B_2O_{12}$, $LiTaO_3$, $KTaO_3$, $AgTaO_3$, $KTaO_3$:Zr, $NaTaO_3$:La, $NaTaO_3$:Sr, $Na_2Ta_2O_6$, $CaTa_2O_6$, $SrTa_2O_6$, $NiTa_2O_6$, $Rb_4Ta_6O_{17}$, $Ca_2Ta_2O_7$, $Sr_2Ta_2O_7$, $K_2SrTa_2O_7$, $RbNdTa_2O_7$, $H_2La_{2/3}Ta_2O_7$, $K_2Sr_{1.5}Ta_3O_{10}$, $LiCa_2Ta_3O_{10}$, $KBa_2Ta_3O_{10}$, $Sr_5Ta_4O_{15}$, $Ba_2Ta_4O_{15}$, $H_{1.8}Sr_{0.18}Bi_{0.19}Ta_2O_7$, Mg—Ta Oxide, $LaTaO_4$, $LaTaO_7$, $PbWO_4$, $RbWNbO_6$, $RbWTaO_6$, $CeO_2$:Sr, $BaCeO_3$, $NaInO_2$, $CaIn_2O_4$, $SrIn_2O_4$, $LaInO_3$, $Y_xIn_{2-x}O_3$, $NaSbO_3$, $CaSb_2O_6$, $Ca_2Sb_2O_7$, $Sr_2Sb_2O_7$, $Sr_2SnO_4$, $ZnGa_2O_4$, $Zn_2GeO_4$, $LiInGeO_4$, $Ga_2O_3^b$, $Ga_2O_3$: $Zn^c$, $Na_2Ti_3O_7$, $K_2Ti_2O_5$, $K_2Ti_4O_9$, $Cs_2Ti_2O_5$, $H^+$—$Cs_2Ti_2O_5$, $Cs_2Ti_5O_{11}$, $Cs_2Ti_6O_{13}$, $H^+$—$CsTiNbO_5$, $H^+$—$CsTi_2NbO_7$, $SiO_2$-pillared $K_2Ti_4O_9$, $SiO_2$-pillared $K_2Ti_{2.7}Mn_{0.3}O_7$, $Na_2W_4O_{13}$, $H^+$—$KLaNb_2O_7$, $H^+$—$RbLaNb_2O_7$, $H^+$—$CsLaNb_2O_7$, $H^+$—$KCa_2Nb_3O_{10}$, $SiO_2$-pillared $KCa_2Nb_3O_{10}$, ex-$Ca_2Nb_3O_{10}$/$K^+$ nanosheet$^4$), Restacked ex-$Ca_2Nb_3O_{10}$/$Na^+$, $H^+$—$RbCa_2Nb_3O_{10}$, $H^+$—$CsCa_2Nb_3O_{10}$, $H^+$—$KSr_2Nb_3O_{10}$, $H^+$—$KCa_2NaNb_4O_{13}$. $Bi_2W_2O_9$, $Bi_2Mo_2O_9$, $Bi_4Ti_3O_{12}$, $BaBi_4Ti_4O_{15}$, $Bi_3TiNbO_9$, $PbMoO_4$, $(NaBi)_{0.5}MoO_4$, $(AgBi)_{0.5}MoO_4$, $(NaBi)_{0.5}WO_4$, $(AgBi)_{0.5}WO_4$, $Ga_{1.14}In_{0.86}O_3$, $\beta$-$Ga_2O_3$, $Ti_{1.5}Zr_{1.5}(PO_4)_4$, $WO_3$, $Bi_2WO_6$, $Bi_2MoO_6$, $Bi_2Mo_3O_{12}$, $Zn_3V_2O_8$, $Na_{0.5}Bi_{1.5}VMoO_8$, $In_2O_3(ZnO)_3$, $SrTiO_3$:Cr/Sb, $SrTiO_3$:Ni/Ta, $SrTiO_3$:Cr/Ta, $SrTiO_3$:Rh, $CaTiO_3$:Rh, $La_2Ti_2O_7$:Cr, $La_2Ti_2O_7$:Fe, $TiO_2$:Cr/Sb, $TiO_2$:Ni/Nb, $TiO_2$: Rh/Sb, $PbMoO_4$: Cr, $RbPb_2Nb_3O_{10}$, $PbBi_2Nb_2O_9$, $BiVO_4$, $BiCu_2VO_6$, $BiZn_2VO_6$, $SnNb_2O_6$, $AgNbO_3$, $Ag_3VO_4$, $AgLi_{1/3}Ti_{2/3}O_2$, $AgLi_{1/3}Sn_{2/3}O_2$, $LaTiO_2N$, $Ca_{0.25}La_{0.75}TiO_{2.25}N_{0.75}$, TaON, $Ta_3N_5$, $CaNbO_2N$, $CaTaO_2N$, $SrTaO_2N$, $BaTaO_2N$, $LaTaO_2N$, $Y_2Ta_2O_5N_2$, $TiN_xO_yF_z$, $Sm_2Ti_2O_5S_2$ and La—In oxysulfide. The disclosure exemplifies the use of Si as the semiconductive material; however, any semiconductive material or combinations of semiconductive materials can be used in any of the embodiments described herein.

As used herein a "sol-gel" refers to a solution that can undergo gelatinizing. Typically, the sol-gel process to form silica and silica-like material layer involves two stages: formation of a sol and a gel. A free flowing solution "sol" is first prepared by dissolving a suitable precursor material in a solvent, such as an alcohol, and water, and then reacted with a reagent in presence of a catalyst to initiate polymerization of the precursor material from a ternary solution. In one example, silicon alkoxide is mixed with water in ethanol to produce growing chains of Si—O—Si. As polymerization and cross-linking proceed, the "sol" is converted into a "gel." The "gel" can be dried using a suitable method such a heating in dry air or extraction with a supercritical fluid such as $CO_2$. Supercritical fluid drying or extraction removes the liquid from the gel, and involves a solvent exchange with a supercritical fluid, such as $CO_2$, followed by supercritical venting in a specialized autoclave. Known methods can be used to carry out supercritical fluid extraction and/or drying. In another case, the water/solution within the gel can be replaced with an alcohol or other solvent that will replace the surface —OH groups in the gel and allow drying to occur at elevated temperatures but standard pressures. Methods are known for other surface modification processes.

The silica precursors for sol-gel reaction can be either inorganic salts, or organic compounds known as metal alkoxides such as tetraethoxysilane, tetramethoxysilane, and the like. The inorganic precursors of silica can be sodium silicates, potassium silicates, and the like. The catalysts can be either acidic (e.g., HCl) or basic (e.g., ammonia). The microstructure of sol-gel processed silca and silica-like material layer can be controlled by changing water/alkoxide molar ratio, the silica precursor, the catalyst type or concentration, the pH, and the like. The sol-gel processed silica and silica-like materials exhibit sponge like properties with aligned spaces or voids inside.

"Stamp" refers to a device component for transfer, assembly and/or integration of structures and materials via printing.

"Substrate" refers to a structure or material on which a process is conducted, such as patterning, assembly and/or integration of semiconductor elements. Substrates include, but are not limited to: (i) a structure upon which semiconductor elements are fabricated, deposited, transferred or supported; (ii) a device substrate, for example an electronic device substrate; (iii) a donor substrate having elements, such as semiconductor elements, for subsequent transfer, assembly or integration; and (iv) a target substrate for receiving printable structures, such as semiconductor elements.

Further the term "vertical" with reference to wires, rods, whiskers, pillars, etc., generally refers to structures that have a length direction that is elevated somewhat from horizontal.

The term "vertical alignment" generally refers to an alignment or orientation of a structure or structures that is elevated from horizontal. The structure or structures do not have to be completely normal to horizontal to be considered to have a vertical alignment.

The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal.

The term "wider band-gap" refers to the difference in bandgaps between a first material and a second material. "Bandgap" or "energy band gap" refers to the characteristic energy profile of a semiconductor that determines its electrical performance, current and voltage output, which is the difference in energy between the valence band maximum and the conduction band minimum. For example, in one embodiment, reference to a wire having a first junction with a "wider band-gap material" refers to a material having a wider band-gap than a second junction of a different material.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure.

The term "p-i-n junction" as used herein means an assembly comprising three semiconducting materials layers in contact with one another, where one layer is p-doped, a second layer is n-doped, and the third layer is an intrinsic semiconductor layer ("i-layer"), where the i-layer is disposed between the p-layer and the n-layer. Each layer can be doped as is understood by one skilled in the art in view of the semiconducting content of each layer. The term "intrinsic" as used herein means a material in which the concentration of charge carriers is characteristic of the material itself rather than the content of impurities (or dopants). A "heterojunction p-i-n junction" as used herein is a p-i-n junction as defined herein wherein the two semiconducting materials comprising the p-layer and n-layer, respectively, have different alloy composition (notwithstanding the doping content of the layers); the i-layer may comprise the same or a different alloy with respect to the p-layer and/or n-layer.

The disclosure provides semiconductive nano- and/or micro-wire arrays (e.g., Si microwire arrays) that can be fabricated through a VLS method that does not use photolithography. Soft lithography provides a scalable alternative to traditional photolithography that has been used to pattern features less than 100 nanometers in scale. The disclosure provides a method for nano- and micro-imprint lithography of a silica sol-gel to create a patterned confining layer of the VLS growth templates, replacing the photolithographically patterned thermal $SiO_2$ layer technique.

Various methods described herein can be used to create a "stamp" for the nano- and/or micro-imprint process. For example, in one embodiment, a stamp used in the nano- and/or micro-imprint process is developed from a rigid silicon master made by photolithographically patterning a thermal $SiO_2$ layer on an Si wafer (e.g., a 3" square wafer). The thickness of the oxide layer can be chosen to be the same as the desired thickness of the sol-gel confining layer (e.g., ~150 nm) used later during patterning of the desired substrate. In other embodiments, the rigid master template can be obtained by photolithography followed by reactive ion etching (RIE) or metal assisted chemical etching (MACE). In another embodiment, nanosphere lithography can be used (e.g., the nanospheres can be used as evaporation masks). The pattern utilized for the rigid template can be any pattern such as an ordered or non-ordered pattern. Furthermore, the size of the pattern can comprise "holes" ranging from a 10's of nanometers in diameter or edge-to-edge to a 1000 microns or more. For example, the diameter can be 100 nm, 500 nm, 1 µm, 2 µm, 3 µm, 4 µm, 5 µm or more. In one embodiment, a square-packed array of 3 µm diameter holes spaced 7 µm from center to center (e.g., a 3×7 µm pitch pattern) can be used. In one embodiment, the stamp master of rigid Si is then used to produce a PDMS stamp (e.g., a bilayer PDMS stamp) that combines a rigid stamping interface with a flexible substrate to allow for conformal patterning. The rigid stamping PDMS (hereafter referred to as x-PDMS) allows the stamp to reproduce, with high fidelity, features on the scale of tens of nanometers, whereas the malleable stamp body provides the flexibility necessary to make conformal contact with the substrate.

Turning to FIG. 1, a process for making an x-PDMS stamp 100 of the disclosure is provided. A suitable rigid substrate 10 such as a silicon wafer is used as the rigid template. The rigid substrate 10 is oxidized to form an oxide layer 15, such as $SiO_2$. The oxide layer is then patterned by etching to form a patterned oxide layer 18. The patterned oxide layer 18 serves as the pattern template for a PDMS layer 25. As mentioned above, the pattern can be highly ordered, ordered or non-ordered. The pattern can take any form including, but not limited to, triangular, square, chirped triangular, chirped square, penrose, dodecagonal, and quasi-random. In some embodiments, a bi-layer of PDMS can be used. For example, FIG. 1 depicts a bilayer of PDMS 20/25, wherein the two layers of PDMS have different gel strengths and are applied to the rigid template 10 comprising patterned oxide 18. The rigid template 10 is then removed to provide a flexible x-PDMS stamp 100.

Figure 2:
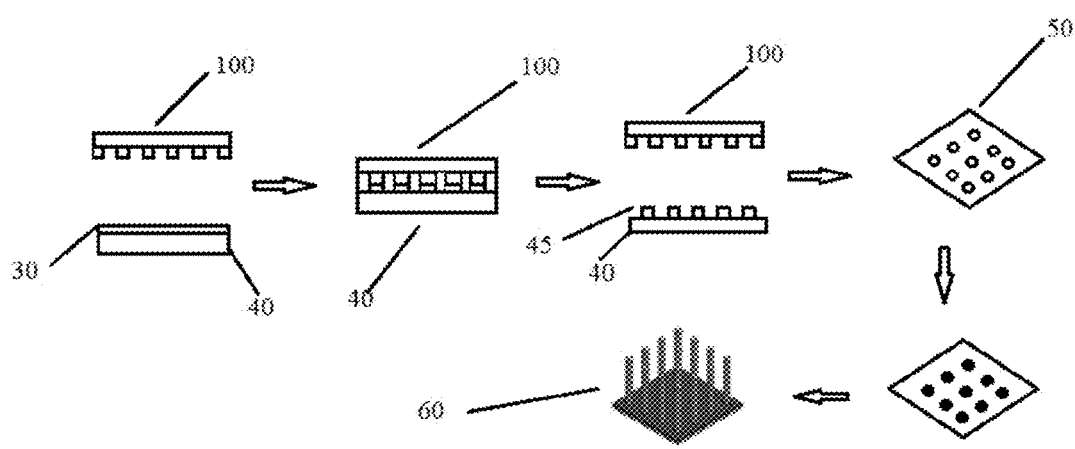
FIG. 2 shows a process of using a template stamp in a process for forming semiconductive elongated structures/photovoltaic devices.

The x-PDMS stamp can then be used to stamp substrate(s). For example, as depicted in FIG. 2, an Si(111) wafer 40 can be used as a substrate for the stamping process. All or portions of the wafer may be doped. For example, a degenerately doped N-type Si wafer may be used. The doped substrate wafer should have the same type of dopant as that which will be used to dope the elongated structure (e.g., wires). For example, if you want to grow p-type wires for photocathodes and are doping with boron, the wafer should be degenerately doped p-type with boron. Before patterning, each Si (111) VLS growth wafer is etched in buffered acid (e.g., hydrofluoric acid) to remove any native oxide. A silica sol-gel 30 is then spin-coated onto the wafer until a uniform, e.g., ~150 nm thick (i.e., a thickness comparable to the thickness of the patterned template), layer of sol-gel is obtained. While the sol-gel is still wet, the bilayer x-PDMS stamp 100 is applied to the wafer 40. For example, a substrate conformal imprint lithography (SCIL) process can be used in which the stamp is attached by a vacuum to a plate with a series of grooves that pressurize sequentially to ensure conformal contact between stamp 100 and wafer 40 to eliminate defects and air bubbles that are introduced. Alternatively, simply using a manual "hand" process can be used, but air-bubbles and other small defects may be caused by this process. The sol-gel material 30 is allowed to cross-link at room temperature for ~1 h, then the stamp 100 is carefully removed, leaving behind a patterned sol-gel layer 45. The patterned sol-gel wafer 50 can be etched and catalyst applied to the patterned holes. The patterned sol-gel layer with catalyst can then be used to grow semiconducting structure (e.g., wires) 60.

A growth catalyst can be thermally evaporated onto the patterned sol-gel wafer 50. For example, 500 nm of gold or copper may be thermally evaporated onto the patterned sol-gel wafer 50 and into the holes. Other catalysts, such as, but not limited to, Cu, Pt or Ni, may also be used.

As described above, stamps replicated from Si masters can be physically pressed into a layer of silica sol-gel or other physical lithography resist that has been spin-coated on top of a silicon <111> wafer. This physical pressure mechanically transfers the negative of the stamp (e.g., an x-PDMS stamp) features onto the sol-gel or resist. To create a periodic array of holes in the sol-gel layer, a stamp containing a periodic array of pillars can be used. Typically the pattern on the stamp will extend from the planar surface of the stamp by a distance equal to or slightly higher than the depth of the sol-gel on the substrate to be stamped. If the stamp does not press all the way through the sol-gel layer to the underlying substrate (e.g., silicon), an etching technique such as wet etching with, for example, buffered hydrofluoric acid (BHF) can be used to etch through the remaining sol-gel in the bottoms of the holes. After etching in BHF, a VLS growth catalyst can be deposited by electrodeposition. Electrodeposition is both less energy intensive and more selective, then the physical vapor deposition that has been used previously, as it only allows the catalyst to be deposited on the conductive silicon surface at the bottom of the holes.

In another method of the disclosure, a PDMS stamp, as described above, having a periodic array of holes, can be used to from an agarose stamp with a patterned array (e.g., periodic array of pillars). The agarose stamp, which is extremely porous, can then be soaked in a dilute (2-6 M) HF solution (or the pillars in the agrose can be used to absorb HF solution). This stamp is then placed in conformal contact with a silicon <111> wafer that has a thermal oxide layer (~300 nm) grown on it. The agarose stamp then acts as a diffusion pump to continuously supply fresh HF etchant to the oxide layer, etching the oxide where the agarose comprising the HF solution contacts it. Depending on the molarity of the HF, the etching process can take anywhere from 5 minutes to half an hour. If the agarose stamp is patterned with a periodic array of pillars, these pillars will then etch holes into the $SiO_2$, creating the desired periodic array of holes for a VLS growth catalyst. As mentioned in the first method, the catalyst can be deposited by thermal evaporation or electrodeposition.

Electrodeposition of copper is a commonly used technique in research and industry. In order to improve adhesion and uniformity of deposition, additive materials are usually added to commercial electrodeposition baths. Since the VLS process is very sensitive to the material quality of the metal catalyst, to produce high quality devices requires a very pure starting material.

To achieve conformal electrodeposition of Cu and high fidelity VLS wire growth, no sol-gel or native oxide should be present on the exposed Si(111) before metal deposition. Although sol-gel also etches in HF, by first densifying the sol-gel on a hotplate (150° C. for 20 minutes), and then etching the wafer in very dilute HF, it was possible to remove the sol-gel and native oxide from the Si(111) patches (e.g., holes) while not impacting the quality of the sol-gel confining layer.

Various commercially available catalyst solutions can be used. However, rather than use commercially available deposition solutions, the disclosure provides a deposition solution consisting of high purity $CuSO_4$ and $H_2SO_4$ that may also contain some high purity adhesion-promoting additives. The disclosure demonstrates that potentiostatic deposition at −0.4 to −0.5 V vs. Ag/AgCl resulted in the most uniform deposition (unlike prior reports using commercial deposition solutions where galvanostatic deposition was used). A high purity (>99.999%) Cu counter electrode can be used as the anode material to avoid any contamination from the oxidized metal at the anode.

After etching, the patterned wafer is placed into a electrodeposition cell comprising a catalyst reagents (e.g., a copper electrodeposition solution and a high purity Cu (99.9999%) rod serving as the counter electrode). For example, in one embodiment, a potentiostatic deposition of Cu at −1.05 V vs. Ag/AgCl was carried out until the desired charge density had been passed.

Figure 3:
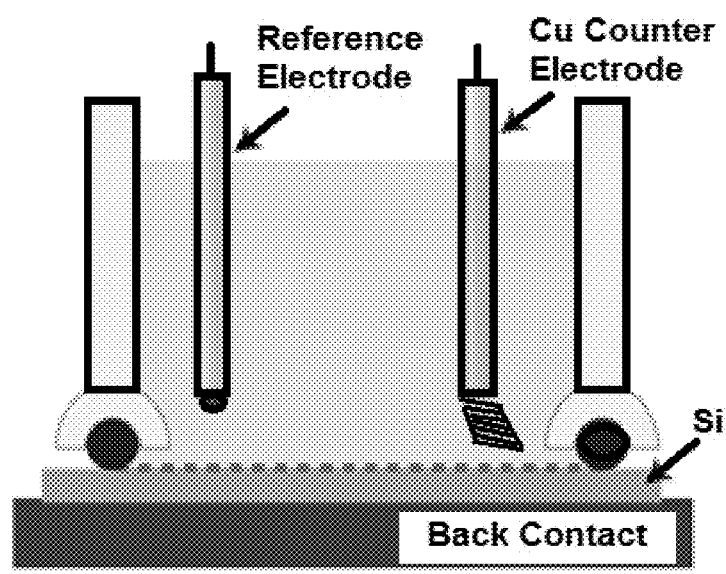
FIG. 3 shows a schematic of an electrodeposition bath used in an embodiment of the invention.

The cell used for electrodeposition comprises, in one embodiment, a flat metallic plate back contact and a glass cell on a wafer. A Teflon O-ring or sealant can be used to seal the cell onto the wafer. The cell had two ports for a reference electrode (e.g., an Ag/AgCl reference electrode) and a Cu counter electrode (see, FIG. 3). Electrodeposition is carried out potentiostatically until the desired amount of charge had passed.

The wafer with the patterned holes and the deposited catalyst may then be annealed. Typically, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer is performed through the application of a growth gas. Typically, elongated structure such as wires are grown in a mixture of $H_2$ (1000 sccm) and $SiCl_4$ (20 sccm) at about 1 atm. The elongated structures may be grown for between 20 to 30 minutes at temperatures between 850° C. to 1100° C. or with different growth times, pressures, and or flow rates.

For example, the sample can be placed into the CVD reactor to grow p-type Si MW arrays. As previously reported, wire growth was carried out at 1000° C. in an $H_2$ environment, using $SiCl_4$ as the Si precursor and $BCl_3$ as the p-type dopant. The diameter of the wires can be determined by the amount of copper electrodeposited, so given the flexibility afforded by electrodeposition, large amounts of material could be quickly and easily deposited to permit the growth of wires of various diameters. Passing ∼−0.2 C. $cm^{-2}$ of charge density resulted in wires that were 2 μm in diameter. The wires grown from the electrodeposited catalyst had high fidelity and uniformity across the growth substrate (FIG. 7).

The grown elongated structure may then be embedded, embedded and removed from the wafer, coated with different band gap material, prepare in combination with ionic membranes to form fuel generators, and/or further modified using any of the descriptions in the following patent application, which are incorporated herein by reference in their entireties: PCT/US13/26909, PCT/US13/21339, PCT/US12/45151, PCT/US11/29663, PCT/US2013/035171, and PCT/US2013/035026.

During a typical VLS process, the patterned substrate is exposed to temperatures of 1000° C. and a flow of $H_2$ and $SiCl_4$ gas. These conditions create HCl gas as a byproduct, and require that the patterned confining layer be robust. To determine whether a silica-sol gel would retain its pattern fidelity during the wire growth process, pieces of a patterned Si wafer were placed into a tube furnace and annealed under $N_2$ (g) for 20 min at temperatures ranging from 100 to 1000° C. Profilometry of the annealed samples showed a slight densification of the sol-gel, but generally revealed retention of the stamped pattern. A patterned wafer chip was also placed into the CVD reactor and sent through the growth process with all variables intact, except for the lack of $SiCl_4$ and $BCl_3$ gases during the "growth" phase of the process. Although there was a slight compaction (<10%) of the sol-gel, the pattern fidelity remained high despite the gas flows and high temperatures, confirming that the sol-gel could be used to replace the confining thermally grown $SiO_2$ layer that has been used previously used to produce Si microwire arrays.

The low-energy, scalable fabrication techniques described herein are capable of producing Si MW arrays with comparable electrical performance to wire arrays created through use of photolithography and thermal evaporation methods.

A scalable, low-cost and low-energy fabrication technique for the growth of vertically-oriented silicon microwire arrays has been described, resulting in the production of Si microwire arrays with equivalent electrical performance to those produced using traditional high-energy, high-cost fabrication methods. Patterning of the growth substrate was accomplished via microimprint lithography using a silica sol-gel, and catalyst deposition was achieved by potentiostatic electrodeposition from commercially available Cu deposition solutions (FIG. 6). This fabrication method is both scalable and robust, allowing for the creation of Si microwire arrays of varying pitch and wire diameter, which can potentially lead to the fabrication of more efficient photocathodes for the hydrogen evolution reaction (HER) and/or form the basis for new sensors and battery electrodes made from Si microwire and nanowire arrays.

For example, a nano- or micro-wire array generated by the methods of the disclosure can be embedded in a glass, polymer wax or other material to embed or form a membrane (e.g., Nafion®). Once embedded the wire array can be mechanically peeled from the growth substrate to make a free-standing device. Furthermore, the as-grown wire arrays can be subsequently in-filled with a polymer or other material and catalyst particles can be deposited on the front and back side of the device. A conductive backing or reflective material such as ITO can be deposited on the surface exposed upon removal from the growth substrate. In yet another embodiment, a catalyst such as a hydrogen or oxygen evolution catalyst can be coated on the device to facilitate, for example, $H_2$ production from $H_2O$. The catalyst can be any number of catalysts useful as hydrogen or oxygen evolution. For example, suitable hydrogen evolution catalyst can be selected from the group consisting of Pt, Co, Cu, Fe, $MoS_x$ where x is nominally 2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. Suitable oxygen evolution catalysts that can be used in the methods and composition of the disclosure can be selected from the group consisting of $IrO_x$ where x is nominally 2, but may be sub or super-stoichiometric, Pt, Co, $Co/(PO_4)^{3-}$, $Co/(BO_3)^{3-}$, CoP, Cu, Fe, Mn, Ni, $Ni/(BO_3)^{3-}$, NiP, Pb, CoFe, $CoPSc_2O_3$, FeMn, NiCo, NiCr, NiCu, NiFe, NiLa, NiLa, $NiPSc_2O_3$, NiSn, NiZn and NiMoFe.

Such wire arrays or structures comprise, in one embodiment, crystalline Si wires of a length long enough to absorb sunlight fully, each wire with a radius matched to its diffusion length, and the wires being regularly spaced, and oriented predominantly vertically, typically over large areas. The wires are undoped or minimally doped. The wires can be "p" or "n".

Embodiments of the disclosure provide structures that are particularly useful for devices such as solar cells, electronic devices, photonic materials that utilize optical properties of periodic structures of light-absorbing or light-directing materials arranged with structural order in another optically different material, sensors, and similar chemical, optical, and electronic devices and structures.

Embodiments of the disclosure comprise wire arrays or other semiconducting structures with control of the size, position, and uniformity of the fabricated wire arrays or structures over a relatively wide area wherein the arrays comprise wires having tandem or multijunction modes. Such wire arrays or structures can comprise crystalline Si wires of a length long enough to absorb sunlight fully, each wire with a radius matched to its diffusion length, and the wires being regularly spaced, and oriented predominantly vertically, typically over large areas. As mentioned above, the dimensions of the underlying wire arrays are typically from about 1-10 µm in diameter and 10-100 µm or greater in length.

Thus, in one embodiment the disclosure provides method to form as well as an array of rods/wires comprising Si having dimensions of about 1-10 micrometers in diameter and about 1 micrometer to about 1 mm in length, the wires may be doped or undoped.

A particular application for undoped or minimally doped wire arrays fabricated according to embodiments of the disclosure is for the use of such wire arrays in photo cells or fuel generating systems. Device analysis has shown that photovoltaic efficiency is maximized in wire arrays when the mean radius of the wires is comparable to the minority carrier diffusion length. This is because of a trade-off between increased current collection and the loss of open-circuit voltage due to the increased junction and surface area.

Hence, embodiments of the disclosure provide wire arrays with aspect ratios particularly suitable for use in solar cell apparatus. Further, embodiments of the disclosure provide for the ability to have relatively dense arrays of wires, further improving the ability of devices using such arrays to convert light to electrical energy.

The generated arrays of the disclosure can be used in an artificial photosynthetic system that utilizes sunlight and water, or other solutions as inputs and produces hydrogen and, for example, oxygen as the outputs. Such a system typically comprises three distinct primary components: a photoanode, a photocathode, and a product-separating but ion-conducting membrane. These components may be fabricated and optimized separately before assembly into a complete water-splitting system.

The photoanode and photocathode may comprise arrays of semiconductive microwire structures of the disclosure comprising a metal catalyst. The catalysts disposed on the semiconductive structures are used to drive the oxidation or reduction reactions at low overpotentials. Typically the catalyst coated on the semiconducting structures/substrates do not block or inhibit light energy from contacting the semiconducting wire array or substrate. Accordingly, the catalyst should cover from about 1-99% of the surface area unless sufficiently transparent to allow light penetration to the underlying semiconducting substrate. The high aspect-ratio semiconductor rod/wire electrodes allow for the use of low cost, earth abundant materials without sacrificing energy conversion efficiency due to the orthogonalization of light absorption and charge-carrier collection. Additionally, the high surface-area design of the wire-based semiconductor array electrode inherently lowers the flux of charge carriers over the rod array surface relative to the projected geometric surface of the photoelectrode, thus lowering the photocurrent density at the solid/liquid junction and thereby relaxing the demands on the activity (and cost) of the electrocatalysts. A flexible composite polymer film may be used to allow for electron and ion conduction between the photoanode and photocathode while simultaneously preventing mixing of the gaseous products. That is, the rod/wire arrays may be embedded in flexible, polymeric membrane materials, allowing the possibility of roll-to-roll system assembly. Separate polymeric materials may be used to make electrical contact between the anode and cathode, and also to provide structural support. Interspersed patches of an ion conducting polymer may be used to maintain charge balance between the two half-cells.

In another embodiment, the photoanode and photocathode components may be electrically, and ionically, interconnected through, but physically separated by, a flexible composite polymer film. Further, multi-component membranes, composed of polymeric materials that exhibit desired mechanical pliability, electronic conductivity, and ion permeability properties for a feasible water electrolysis system may be used. Specifically, polypyrrole may be used to make electrical contact between the anode and cathode, while poly (dimethylsiloxane) (PDMS) may be used to provide structural support for the semiconductor rod/wire arrays. For proton conduction in a cell operated under acidic conditions, Nafion® may be employed, whereas vinylbenzyl chloride modified films of poly(ethylene-co-tetrafluoroethylene) (ETFE) may be used for hydroxide conduction in a cell operated under alkaline conditions.

The following examples are meant to illustrate, not limit, the disclosed invention.

EXAMPLES

Microimprint stamps were fabricated by casting two layers of PDMS with different gel strengths onto a reusable master made from a Si wafer coated with thermal oxide. For the pattern a square-packed array of 3 µm diameter holes spaced 7 µm from center to center was used and the oxide thickness, and therefore the height of the stamp features, was 150 nm.

The high gel-strength x-PDMS was made by combining vinylmethylsiloxane copolymer, platinum-divinyltetramethyldisiloxane complex in xylene, vinyl modified Q silica resin (50% in xylene) and 1,3,5,7-tetravinyl-1,3,5,7-tetramethylcyclotetrasiloxane (all components from Gelest, Inc.). These reagents were mixed for 1 min and defoamed for 1 min (Thinky Conditioning Mixer, Phoenix Equipment, Inc.), and then the mixture was degassed in a vacuum chamber for 2 min. Hydride functional polydimethylsiloxane was added as a curing agent, and the ingredients were then mixed and defoamed for an additional 1 min. After degassing for 8 min, the x-PDMS was spin-coated onto the silicon master (which had been treated with trimethylchlorosilane to prevent adhesion) at 500 rpm for 60 s. The thickness of this layer was ~26 μm, as determined by contact profilometry (Dektak). While the x-PDMS layer pre-cured for 10 min at 55° C., a mixture of 10:1 Sylgard 184 (Dow Corning) PDMS was made by combining the monomer and curing agent, mixing for 1 min, and defoaming for 5 min. The 10:1 PDMS was then poured over the wafer, degassed for an additional 10 min, and the stamp was cured overnight at 80° C.

A degenerately doped, non-photoactive Si(111) wafer (with a resistivity, $\rho < 0.003$ Ω-cm, Addison Engineering, Inc.) was cleaned in buffered HF(aq) for 1 min to remove any native oxide, and was then thoroughly rinsed in 18 MΩ-cm resistivity deionized $H_2O$. A layer of sol-gel material (Philips) ~150 nm thick was spin-coated onto the wafer. The bilayer stamp was pressed into the sol-gel, and a glass slide was used to force out any air bubbles between the wafer and the stamp. The stamp and wafer were dried under ambient conditions for 1 h, to allow the solvents to diffuse out through the PDMS stamp and to allow the sol-gel to fully crosslink. The stamp was then peeled away from the wafer.

The sol-gel was densified by heating at 150° C. on a hotplate for 20 min. The sample was immersed in a dilute (2% by volume) HF(aq) solution to remove any residual sol-gel or native oxide from the patterned regions of the wafer. By carefully controlling the length of this etch, it was possible to expose the conductive silicon substrate at the bottom of the holes, but leaving behind a confining $SiO_2$ layer elsewhere. The wafer was then rinsed with 18 MΩ-cm resistivity deionized $H_2O$ and dried.

A pressed electrochemical cell (FIG. 3) was used to prevent the need for epoxy or other methods of insulating the backside of the wafer during electrodeposition of Cu. A stainless steel back plate created an ohmic contact to the degenerately-doped wafer, and an o-ring and clamp created a water-tight seal between the wafer and pressed cell. The Cu for electrodeposition was supplied by use of an aqueous commercial Cu electrodeposition solution (pH=9, Copper Primer, Clean Earth Solutions), along with a 99.999% Cu rod as the counter electrode. Cyclic voltammetry from −0.50 V to −1.50 V at a scan rate of 50 mV s$^{-1}$ was used to determine the optimal potential for potentiostatic deposition (−1.05 V vs. Ag/AgCl). In this particular array geometry, −0.2 C. cm$^{-2}$ charge density was passed to produce the deposited Cu catalyst to create Si microwires that were 2 μm in diameter. Once the Cu electrodeposition was complete, the electrodeposition solution was carefully pipetted out of the cell, and the wafer was gently rinsed and dried.

For a given area of exposed silicon, the more charge passed, the more copper is electrodeposited. Due to the selective nature of the deposition, the copper builds up in the holes in the sol-gel layer. It is possible, then, to use the amount of charge passed to control the thickness of the copper within each hole, which in turn determines the final diameter of the VLS grown wire. If you deposit too little copper, when the wafer is heated to 1000° C., the copper can separate into multiple wire nucleation sites, allowing multiple wires to grow out of each hole. The hole diameter also puts a limit on the final wire diameter, i.e. it is not possible to grow uniform arrays of wires with diameters larger than the patterned hole diameter. Talk about charge control to get a given thickness.

The Si substrate wafer, with electrodeposited Cu, was then sliced into chips ~1.5 cm×3 cm in size, and the chips were rinsed with isopropanol and then thoroughly dried in a stream of $N_2$ (g). A chip was then placed in a quartz tube in a chemical vapor deposition (CVD) system, and exposed to vacuum for at least 30 min, to remove oxygen and adsorbed gases. The tube was then heated to 1000° C. under He and the chip was annealed for 20 min at 750 torr under a 500 sccm flow of $H_2$ (g). Si MWs were grown using 450 sccm of $H_2$, 50 sccm of $SiCl_4$ and 1.3 sccm of $BCl_3$ (to create p-type microwires), with a growth time of 8-20 min, depending on the desired microwire length. The sample was cooled under $H_2$ to 750° C. over the course of 5 min, and was then cooled to room temperature (under ~750 torr of He) over the course of 20 min.

Prior to electrochemical testing, the wire arrays were cleaned, processed and made into electrodes using an RCA2 (5:1:1 $H_2O$:HCl:30% $H_2O_2$ at 70° C.).

A dry thermal oxide ~150 nm thick was grown at 1100° C. over the entire array. The oxide-coated arrays were then infilled with a mixture of 10:1 Sylgard 184 PDMS mixed 1:3 (v:v) with toluene (Sigma, reagent grade), to protect the oxide at the base of the microwires. This mixture had a sufficiently low viscosity to spin into the Si MW arrays and create a layer that was ~20 μm thick. The arrays were then briefly etched in a 3:1 solution of 1-methyl-2pyrrolidinone (NMP, Sigma-Aldrich, 99.5%):tert-butyl ammonium fluoride (Sigma-Aldrich, 75 wt % in water) to remove any PDMS from the wire tops, and were then etched for 3 min in BHF to remove the thermal oxide from the wire tops. To remove the PDMS infill, the samples were etched for >30 min in the same 3:1 solution of 1-methyl-2pyrrolidinone:tert-butyl ammonium fluoride.

The fidelity of the patterned template was confirmed by optical microscopy, scanning electron microscopy (SEM), profilometry and atomic force microscopy (AFM). The microwire arrays fidelity was confirmed by SEM and the electrochemical performance was measured using a PAR 273 potentiostat.

Figure 4:
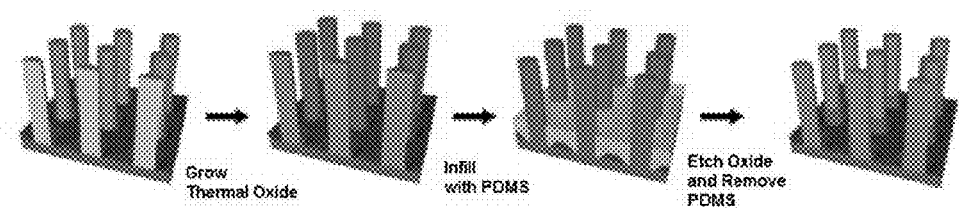
FIG. 4 shows a schematic of a wire booting process.

To evaluate the electrical performance of the microwire arrays, the wires were cleaned using an RCA etch to remove the Cu growth catalyst and other impurities, then processed and made into electrodes. Further processing is necessary because the degenerately doped growth wafer and the microwire bases can provide pathways for shunting during electrochemical testing. To protect this interface from the electrolyte, an oxide boot was grown on the microwires (FIG. 4), by growth of a ~150 nm thick dry thermal oxide over the entire surface of the sample at 1000° C. for 2 h.26 The oxide also acted to getter out impurities in the wires from the growth process, and the etching off of this layer removes the impurities. The oxide was selectively protected at the wire bases and growth substrate and was etched off everywhere else.

Electrodes were made by breaking the substrates coated with Si wire arrays into chips with areas between 0.01 cm$^2$ and 0.1 cm$^2$. Epoxy (Loctite 9460) was used to define the active area of the electrodes. A Ga—In eutectic was scatched into the back of the chips, to create an ohmic contact to the p+ silicon substrate and each chip was attached to a coil of tinned Cu wire with Ag paint. The electrodes were sealed into glass tubes ~18 cm in length and the back, sides and any exposed wire were covered in epoxy (Loctite 9460, Hysol 1C) to ensure that the only path for the photogenerated carriers was from the microwire sample through the insulated wire to the potentiostat. A scanner and image processing software (ImageJ) was used to determine the electrode areas.

To evaluate the electrical performance of the microwire arrays, the electrodes were tested in both the clear and reduced forms of the methyl viologen2+/+ redox couple. The electrochemical cell used was bottom illuminated and had ports for a Pt mesh counter electrode (behind a glass frit), a SCE reference electrode, and carbon cloth counter and reference electrodes. The Pt counter and SCE were used to confirm current densities in the oxidized methyl viologen solution, and the carbon cloth counter and reference were used during the collection of the J-V curves in the reduced solution. A calibrated Si photodiode placed next to the working electrode was used to monitor the light intensity during the experiments. To decrease mass transport effects, rapid stirring was used during all scans.

The electrodes were tested in an aqueous solution of 50 mM MV2+/+ in a solution of 0.10 M phthalate buffer and 0.40 M potassium sulfate (adjusted to pH=3.0). An 808 nm diode laser was used to minimize optical absorption by the reduced species (MV+), with the light intensity measured by a calibrated photodiode that was placed directly adjacent to the electrode. J-E (cyclic voltammograms, 40 mV s$^{-1}$) data were taken in the clear (oxidized) solution from −0.050 V to −0.60 V vs. a saturated calomel electrode (SCE) to determine the limiting cathodic current density of the sample. For these scans, a platinum mesh electrode that was placed behind a glass frit was used as the counter electrode, and a SCE was used as the reference electrode. During all J-E sweeps, the Ar-purged solution was vigorously stirred to minimize mass transport effects. Using a carbon cloth working electrode, the methyl viologen was then potentiostatically reduced at −0.60 V vs. SCE until the solution potential was as close to −0.60 V vs. SCE as possible, resulting in a deep violet color in the solution. Another set of J-E data (cyclic voltammograms, 40 mV s$^{-1}$) were taken starting at 0.05 V positive of the open-circuit potential of the sample and ending at 0.10 V vs. the solution potential (as measured with a carbon cloth electrode). For the sweeps in the reduced MV2+/+ solution, a large carbon cloth electrode was used as the counter electrode and a smaller carbon cloth electrode served as the reference electrode.

The potential data were corrected for iR losses using:

$$V_{corr} = V - iR_{cell} - \eta_{conc} \quad (1)$$

whereas the correction for concentration overpotential ($\eta_{conc}$) was obtained using:

$$\eta_{conc} = \frac{k_B T}{nq}\left[\ln\left(\frac{J_{l,a}}{J_{l,c}}\right) - \ln\left(\frac{J_{l,a} - J}{J - J_{l,c}}\right)\right] \quad (2)$$

In eqn (2), kB is Boltzmann's constant, T is the absolute temperature, n is the number of moles of electrons transferred, q is the unsigned charge on an electron, $J_{l,a}$ is the anodic limiting current density, and $J_{l,c}$ is the cathodic limiting current density. To determine the limiting anodic and cathodic current densities, a glassy carbon working electrode was used, and J-E data (with a carbon cloth reference electrode and a carbon cloth counter electrode) were taken from 0.00 V to −0.40 V to +0.20 V vs. the carbon cloth reference electrode. The data were corrected according to eqn (4), with the slope of the corrected voltage data yielding a value for $R_{cell}$. To ensure that the data were not overcorrected, a planar p-Si wafer sample was run at the same time as the wire array electrodes, and the corrections were first applied to the planar sample. The values of $V_{oc}$ and $J_{sc}$ are not be affected by the corrections, and only the fill factor is affected. The J-E data from the wire array electrodes were then corrected using eqn 3, and the figures of merit for each electrode were extracted from the corrected data.

The arrays were then made into electrodes and tested for their photoelectrochemical performance in contact with a 50 mM solution of the one-electron, reversible, methyl viologen (MV2+/+) redox couple. The MV2+/+ redox couple makes a conformal, high barrier height contact to p-type Si and has previously been used with an 808 nm diode laser light source to study the performance of similar p-Si MW arrays. The champion Si MW electrode grown from microimprint/electrodeposition exhibited the following figures of merit when measured at normal incidence to the light source: open-circuit voltage (Voc)=400±7 mV, short-circuit current density (Jsc)=6.8±0.5 mA cm−2, external quantum yield at short circuit (Φext,sc)=0.17±0.02, fill factor (ff)=0.52±0.03 and efficiency under 808 nm illumination (η808)=2.4±0.2% (FIG. 8). Averaging across six devices, the figures of merit for the microwire arrays under investigation were Voc=380±10 mV, Jsc=7±2 mA cm−2, Φext,sc=0.17±0.05, ff=0.5±0.1 and η808=2.1±0.3%. These figures are comparable to the figures of merit for Si microwires grown from photolithographically patterned oxide templates and thermally evaporated high-purity Cu, with the largest difference arising from the open circuit voltage, which was only ~30 mV smaller than that observed for wires grown with 6N Cu.

Figure 9:
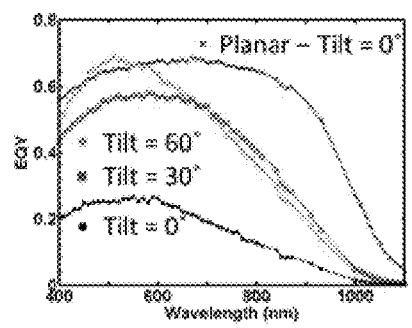
FIG. 9 shows a spectral response graph for SiMW arrays.

A spectral response system, which measures the external quantum efficiency of the electrode for wavelengths from 400 nm to 1100 nm, was used to characterize the light absorption properties of the arrays. This photovoltaic response depends on the angle at which the light strikes the arrays, so measurements were taken at angles of approximately normal to the array, 30° and 60°, respectively. FIG. 9 displays the angle-dependence of the spectral response of the Si MW arrays between 400 nm to 1100 nm. The spectral response of the wire arrays that were grown from the new templating method was nearly identical to that of wire arrays grown from 6N Cu using previously described techniques.31

The spectral response system consisted of a 150 W xenon lamp light source and a monochromator (Oriel), along with a potentiostat (Gamry Series G 300), and a 30 Hz chopper as has been described previously. The electrodes were immersed in the MV2+/+ redox couple (50 mM), and was potentiostatically poised at −0.5V vs. SCE. A beam splitter and reference photodiode provided a continuous measurement of the monochromator output light intensity. The potentiostat measured both the current from the Si MW working electrode and from the reference photodiode. This data was then analyzed to compute an external quantum yield for each wavelength to determine the spectral response characteristics of the microwire arrays.

Although a number of embodiments and features have been described above, it will be understood by those skilled in the art that modifications and variations of the described embodiments and features may be made without departing from the teachings of the disclosure or the scope of the invention as defined by the appended claims.

What is claimed is:
1. A method for fabricating semiconductor structures comprising the steps of:
(a) contacting a semiconductive substrate having a thermal oxide layer with a stamp comprising agarose containing hydrofluoric acid and wherein the agarose stamp has a pattern of structures extending from the planar surface of the agarose approximately equal to the depth of the thermal oxide layer on the semiconductive substrate, wherein the stamp imprints the negative of the pattern into the thermal oxide layer;
(b) removing the stamp from the semiconductive substrate;
(c) electrodepositing a catalyst into patterned openings directly onto the semiconductive substrate; and
(d) growing a set of semiconductor structures on the substrate, wherein the semiconductor structure growth is supported by a catalyst deposited in the openings.

2. The method of claim 1, wherein the semiconductive substrate comprises silicon.

3. The method of claim 1, wherein the catalyst comprises gold, copper, nickel or some combination thereof.

4. The method of claim 1, further comprise etching the thermal oxide layer in hydrofluoric acid after step (b).

5. The method of claim of claim 1, further comprising reusing the substrate for fabricating additional semiconductor structures by etching and cleaning the Si substrate and repeating steps (a) through (d).

6. The method of claim 1, further comprising embedding or partially embedding the fabricated semiconductor structures in a binder material matrix wherein the conformably fills gaps between grown semiconductor structures.

7. The method according to claim 1, wherein semiconductor structures comprise vertically aligned wire arrays.

* * * * *